(12) United States Patent
Saeki et al.

(10) Patent No.: US 12,471,235 B2
(45) Date of Patent: Nov. 11, 2025

(54) ELECTRONIC APPARATUS

(71) Applicant: FANUC CORPORATION, Yamanashi (JP)

(72) Inventors: Masahiro Saeki, Yamanashi-ken (JP); Shinichi Kuwahata, Yamanashi-ken (JP); Asunaro Maeda, Yamanashi-ken (JP)

(73) Assignee: FANUC CORPORATION, Yamanashi (JP)

( * ) Notice: Subject to any disclaimer, the term of this patent is extended or adjusted under 35 U.S.C. 154(b) by 175 days.

(21) Appl. No.: 18/551,367

(22) PCT Filed: Mar. 11, 2022

(86) PCT No.: PCT/JP2022/010779
§ 371 (c)(1),
(2) Date: Sep. 19, 2023

(87) PCT Pub. No.: WO2022/202392
PCT Pub. Date: Sep. 29, 2022

(65) Prior Publication Data
US 2024/0172386 A1 May 23, 2024

(30) Foreign Application Priority Data
Mar. 24, 2021 (JP) .................... 2021-050066

(51) Int. Cl.
*H05K 7/14* (2006.01)
(52) U.S. Cl.
CPC ......... *H05K 7/1469* (2013.01); *H05K 7/1465* (2013.01)
(58) Field of Classification Search
CPC .................... H05K 7/1469; H05K 7/1465
See application file for complete search history.

(56) References Cited

U.S. PATENT DOCUMENTS

| | | | | |
|---|---|---|---|---|
| 7,383,452 | B2 * | 6/2008 | Veselic | G06F 1/266 |
| | | | | 710/72 |
| 8,793,409 | B2 * | 7/2014 | Chen | G06F 13/4068 |
| | | | | 710/16 |

(Continued)

FOREIGN PATENT DOCUMENTS

| | | |
|---|---|---|
| EP | 3771962 A1 | 2/2021 |
| JP | S56157088 A | 12/1981 |

(Continued)

OTHER PUBLICATIONS

International Search Report issued by the Japan Patent Office acting as the International Searching Authority in relation to International Application No. PCT/JP2022/010779 dated May 31, 2022 (3 pages) along with English language translation (2 pages).

(Continued)

*Primary Examiner* — Henry Tsai
*Assistant Examiner* — John B Roche
(74) *Attorney, Agent, or Firm* — CARTER, DELUCA & FARRELL LLP

(57) ABSTRACT

An electronic apparatus for inputting and outputting signals is provided with a plurality of processing circuits for inputting and outputting signals, a plurality of common power terminals connected to different processing circuits to supply power to each of the plurality of processing circuits, a plurality of individual power terminals connected to different processing circuits to supply power to each of the plurality of processing circuits, and a conductive member which is detachably provided and electrically connects the plurality of common power terminals.

10 Claims, 8 Drawing Sheets

(56) References Cited

U.S. PATENT DOCUMENTS

| | | | | |
|---|---|---|---|---|
| 10,742,211 | B1* | 8/2020 | Gan | ............... G06F 1/26 |
| 2012/0044082 | A1* | 2/2012 | Molnar | ............ H01R 13/717 |
| | | | | 340/687 |
| 2020/0251888 | A1 | 8/2020 | Satou | |
| 2020/0396857 | A1* | 12/2020 | Chakraborty | ........ H05K 7/1465 |

FOREIGN PATENT DOCUMENTS

| | | |
|---|---|---|
| JP | H0865918 A | 3/1996 |
| JP | 2004038743 A | 2/2004 |
| JP | 2014228900 A | 12/2014 |
| JP | 2016110460 A | 6/2016 |
| TW | 202043089 A | 12/2020 |

OTHER PUBLICATIONS

Written Opinon of the International Searching Authority issued by the Japan Patent Office acting as the International Searching Authority in relation to International Application No. PCT/JP2022/010779 dated May 31, 2022 (4 pages).

Extended European Search Report for Application No. 22775184.9 dated Mar. 10, 2025, 8 pages total.

Decision to Grant issued in Japanese Application No. 2023-509010, Jul. 30, 2024, (3 pages), English translation (2 pages), 5 total pages.

* cited by examiner

ELECTRONIC APPARATUS

CROSS-REFERENCE TO RELATED APPLICATIONS

This application is a national phase entry under 35 U.S.C. 371 of PCT International Application No. PCT/JP2022/010779, filed Mar. 11, 2022, which claims priority to Japanese Patent Application No. 2021-050066, filed Mar. 24, 2021, the disclosure of each of these applications is expressly incorporated herein by reference in their entirety.

TECHNICAL FIELD

The present invention relates to an electronic device (electronic apparatus).

BACKGROUND ART

JP 2016-110460 A discloses a programmable logic controller system. The programmable logic controller system includes a base unit (master) and a plurality of expansion units (electronic device). The plurality of electronic devices are slaves of the base unit. The base unit transmits and receives signals to and from a controlled device via the plurality of electronic devices. The plurality of electronic devices are arranged in series with the base unit being at the head. The controlled device is a device such as a sensor or an actuator, for example.

SUMMARY OF THE INVENTION

The electronic device outputs an output signal using power supplied from a power supply. The electronic devices include a model that receives electric power supplied from one power supply (common power supply) together with other electronic devices, and a model that receives electric power supplied from different power supplies (individual power supplies) for each electronic device.

There is a case in which the operator may want to select whether to supply electric power to a plurality of electronic devices from one power supply or to supply electric power to each electronic device from a different power supply individually, depending on the situation. However, in the conventional electronic device, there is a problem that the connection mode for the electronic device with the power supply is limited depending on the model of the electronic device, as described above.

The present invention has the object of solving the aforementioned problems.

According to an aspect of the present invention, there is provided an electronic device that performs input and output of a signal, including: a plurality of processing circuits configured to perform input and output of the signal; a plurality of common power terminals connected respectively to the different processing circuits to supply electric power to each of the plurality of processing circuits; a plurality of individual power terminals connected respectively to the different processing circuits to supply electric power to each of the plurality of processing circuits; and a conductive member attachably and detachably provided and configured to electrically connect the plurality of common power terminals to each other.

According to the present invention, there is provided an electronic device capable of easily changing a connection mode to a power supply.

DETAILED DESCRIPTION OF THE INVENTION

Embodiments

Figure 1:
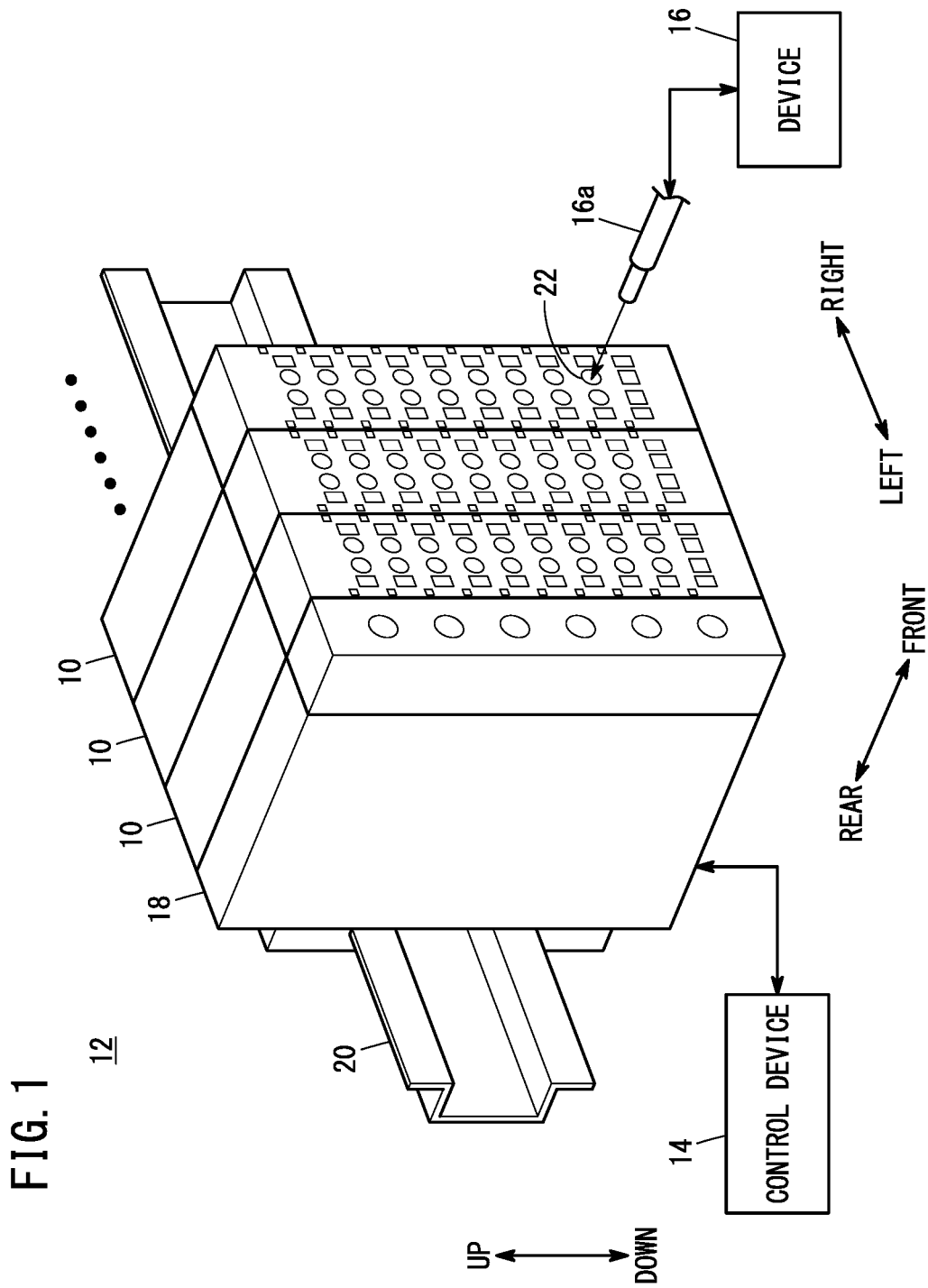
FIG. 1 is a diagram illustrating a communication system configured to include an electronic device according to an embodiment of the present invention.

FIG. 1 is a diagram illustrating a communication system 12 configured to include an electronic device 10 according to an embodiment of the present invention. Arrows in FIG. 1 indicate directions (front, rear, left, right, up, and down) used for the following descriptions. The front-rear direction, the left-right direction, and the up-down direction are orthogonal to each other. The arrows in the other figures correspond to those in FIG. 1 unless otherwise indicated.

The communication system 12 is a system that transmits signals between a control device 14 and a device 16. The communication system 12 includes a communication coupler unit 18 and a plurality of electronic devices 10. The communication coupler unit 18 is a master unit. The plurality of electronic devices are slave units of the communication coupler unit 18. The electronic device 10 is, for example, an I/O unit (input/output unit).

The communication coupler unit 18 is connected to the control device 14. The control device 14 is an electronic device that controls a mechanical device such as a machine tool or a robot. The communication coupler unit 18 further includes a connection terminal that can be connected to the electronic device 10. The connection terminal is provided at a portion of the communication coupler unit 18 that is adjacent to the electronic device 10. Note that the connection terminal of the communication coupler unit 18 are not shown.

Each of the plurality of electronic devices 10 is connected to the device 16. The device 16 is, for example, an actuator such as a switch. The actuator is provided in, for example, the machine tool or the robot. The actuator operates in response to a signal input from the electronic device 10. In this regard, the device 16 includes a terminal (external terminal) 16a for connection with the electronic device 10. The device 16 may output a signal to the control device 14 via the electronic device 10.

The communication coupler unit 18 and the plurality of electronic devices 10 are arranged along the left-right direction. Here, the communication coupler unit 18 and the plurality of electronic devices 10 are installed on a predetermined installation member 20. The installation member 20 is, for example, a DIN rail. The installation member 20 of FIG. 1 extends along the left-right direction. Further, the installation member 20 is disposed behind the communication coupler unit 18 and the plurality of electronic devices 10.

The control device 14 and the device (s) 16 are connected via the communication system 12. The control device 14 transmits signals to the device 16 via the communication system 12. The control device 14 also receives signals from the device 16 via the communication system 12. Each of the communication coupler unit 18 and the electronic device 10 performs signal processing such that signals are appropriately transmitted and received between the control device 14 and the device 16. Descriptions on the details of the signal processing performed by the communication coupler unit 18 are omitted.

Figure 2:
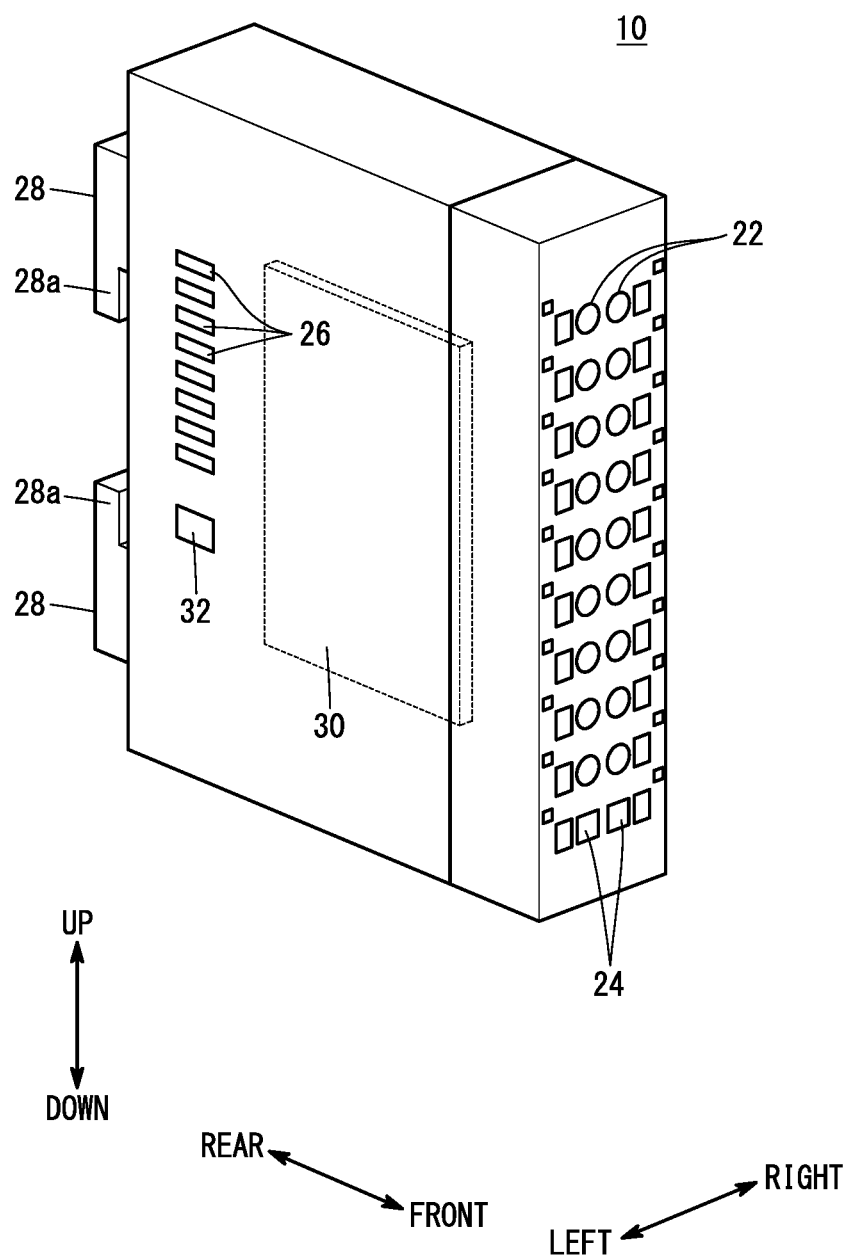
FIG. 2 is a perspective view of the electronic device of FIG. 1.

FIG. 2 is a perspective view of the electronic device 10 of FIG. 1.

The electronic device 10 preferably has a substantially flat plate shape that is thin in a direction (left-right direction) in which the communication coupler unit 18 and the other electronic devices 10 are arranged in series. Thus, the communication system 12 becomes compact in size. The electronic device 10 includes a plurality of inserted portions 22, a plurality of power connectors 24, a plurality of contactors 26, end engagement portions 28, a signal processing module 30, and a conductive member 32 (see FIG. 2).

The plurality of inserted portions 22 are provided on the front side of the electronic device 10. The plurality of external terminals 16a (see FIG. 1) are inserted into the plurality of inserted portions 22. Each of the plurality of inserted portions 22 is appropriately equipped with a terminal electrically connected to the inserted external terminal 16a. The terminal electrically connected to the external terminal 16a are not shown.

Each of the plurality of power connectors 24 is a connector for connecting to an external power supply. The plurality of power connectors 24 are provided on the front side of the electronic device 10, similarly to the plurality of inserted portions 22. The number of the power connectors 24 is the same as the number of individual power terminals 40 (see FIG. 3) described later. In FIGS. 1 and 2, the plurality of power connectors 24 are provided at the lowest portion of the electronic device 10, but the present invention is not limited to this.

Figure 4:
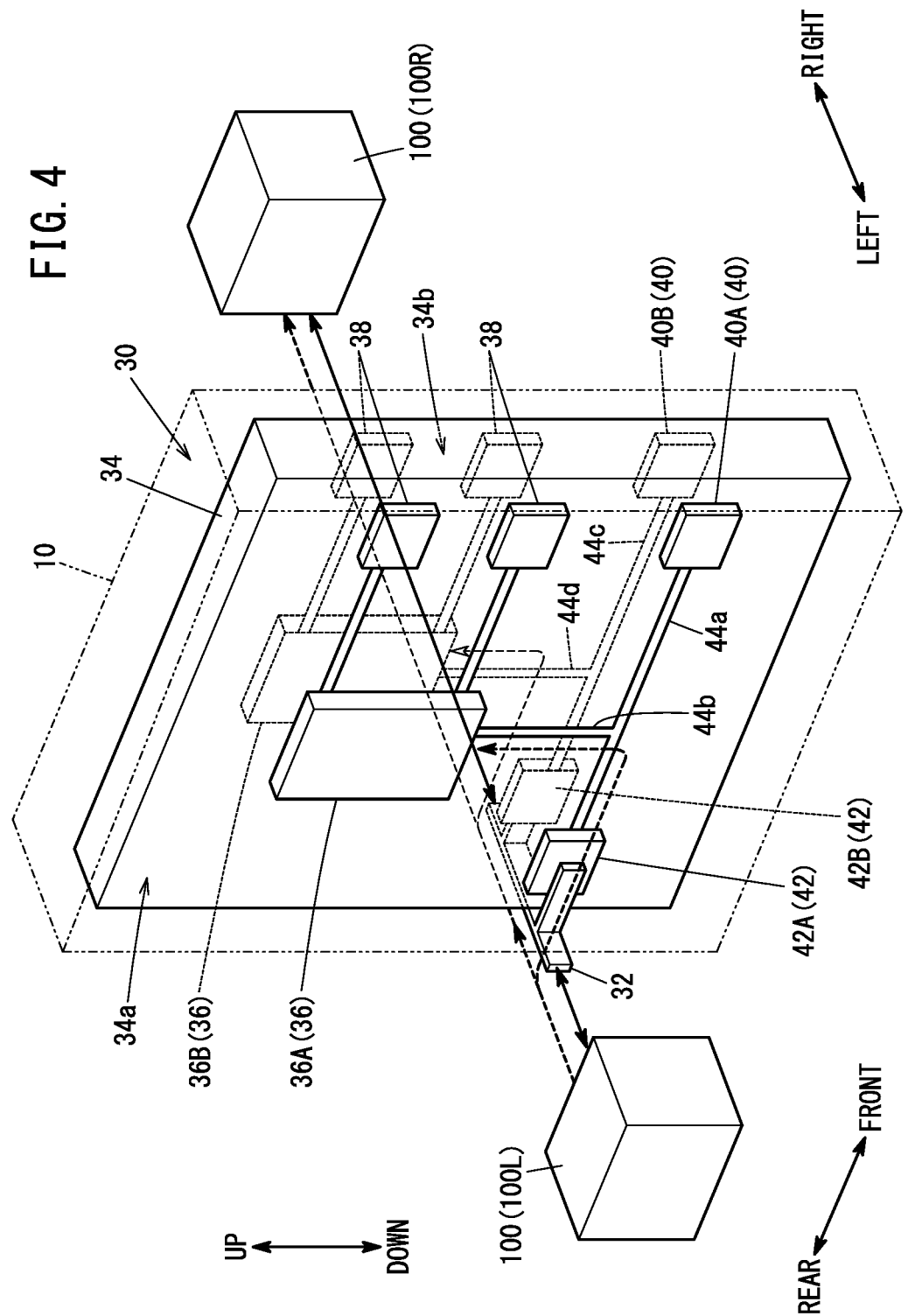
FIG. 4 is a view showing a state in which a conductive member is attached to the signal processing module of FIG. 3.

Each of the plurality of contactors 26 is a member for electrically connecting the electronic device 10 to another unit 100 (see also FIG. 4). The other unit 100 is another electronic device (10) adjacent to the electronic device 10 in the left-right direction or a communication coupler unit (18). One or more contactors 26 are provided on each of the left side of the electronic device 10 and the right side of the electronic device 10. Illustration of the right side of the electronic device 10 is omitted. The plurality of contactors 26 constitute a transmission path for inputting and outputting signals between the electronic device 10 and the other unit 100.

The end engagement portions 28 cause the electronic device 10 to engage with the installation member 20 (see FIG. 1). Each of the end engagement portions 28 includes, for example, a claw 28a. The claw 28a is engageable with the installation member 20. The end engagement portions 28 are provided at a rear portion of the electronic device 10.

The signal processing module 30 is a module (a group of electronic components or a circuit) configured to be electrically connected to the plurality of external terminals 16a and the other units 100. The signal processing module 30 inputs and outputs signals to and from the other unit 100 which is conducted thereto.

Figure 3:
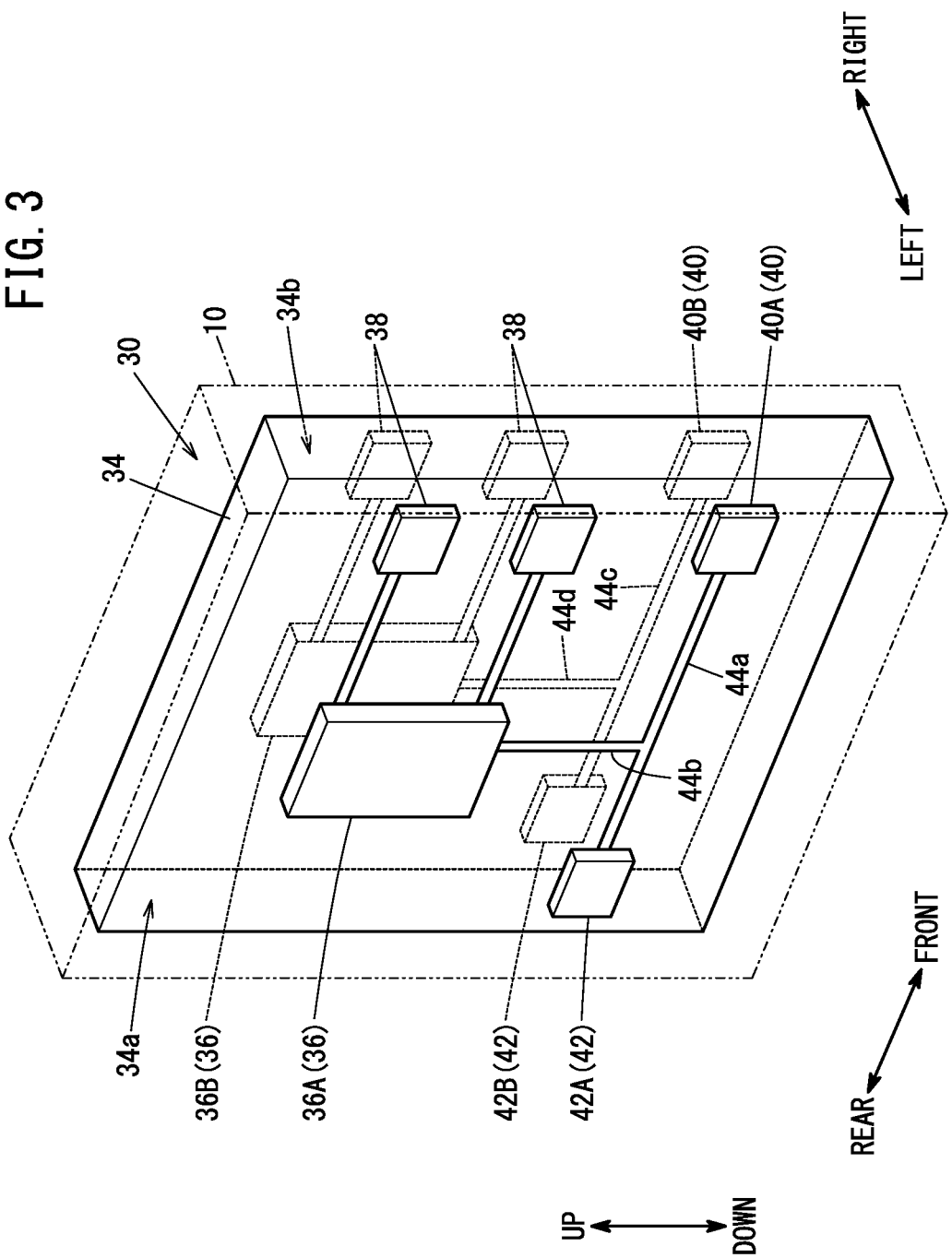
FIG. 3 is a diagram representing a signal processing module of the electronic device of FIG. 2.

FIG. 3 is a diagram illustrating the signal processing module 30 of the electronic device 10 of FIG. 2.

The signal processing module 30 exemplified in the present embodiment includes a circuit board 34, a plurality of processing circuits 36, a plurality of signal output terminals 38, a plurality of individual power terminals 40, and a plurality of common power terminals 42. The plurality of processing circuits 36, the plurality of signal output terminals 38, the plurality of individual power terminals 40, and the plurality of common power terminals 42 are provided on the circuit board 34.

Each of the plurality of processing circuits (communication circuits) 36 includes, for example, a driver circuit and a control integrated circuit (IC) as appropriate. The driver circuit outputs a signal to the device 16 by using the supplied electric power. The control IC controls the supply of power to the driver circuit. Each of the plurality of processing circuits (in particular, the control ICs) 36 processes signals input from the other unit 100 through the contactor 26 and processes signals input from the device 16 through the external terminal 16a. Descriptions on a more specific configuration of the processing circuit 36 is omitted.

In the present embodiment, the number of the plurality of processing circuits 36 is two for illustration. The circuit board 34 has one surface (first surface) 34a and the other surface (second surface) 34b. The two processing circuits 36 are provided respectively on the first surface 34a and the second surface 34b.

The processing circuit 36 provided on the first surface 34a is hereinafter also referred to as a first processing circuit 36A. The processing circuit 36 provided on the second surface 34b is hereinafter also referred to as a second processing circuit 36B.

The plurality of signal output terminals 38 are provided to electrically connect the plurality of external terminals 16a inserted into the plurality of inserted portions 22, to the plurality of processing circuits 36. The number of the signal output terminals 38 is the same as the number of the inserted portions 22. However, in order to avoid complication of the drawing, the number of the signal output terminals 38 shown in FIG. 3 is "4", and the other signal output terminals 38 are not shown.

The plurality of signal output terminals 38 are connected to the plurality of processing circuits 36. The number of the signal output terminals 38 connected to each processing circuit 36 is not particularly limited. The number of the signal output terminals 38 connected to each processing circuit 36 may be different. However, all the signal output terminals 38 are connected to any one of the plurality of processing circuits 36.

Each of the plurality of individual power terminals 40 is, for example, an electrode pad. The plurality of individual power terminals 40 are provided for electrical connection with a power supply. Each of the plurality of individual power terminals 40 is electrically connected to the power supply through the corresponding one of the power connectors 24 that are provided corresponding respectively to the individual power terminals 40.

The plurality of individual power terminals 40 are electrically connected respectively to the different processing circuits 36. The plurality of individual power terminals 40 include a first individual power terminal 40A and a second individual power terminal 40B. The first individual power terminal 40A is electrically connected to the first processing circuit 36A. The second individual power terminal 40B is electrically connected to the second processing circuit 36B.

Each of the plurality of common power terminals 42 is, for example, an electrode pad. The plurality of common power terminals 42 are electrically connected respectively to the different processing circuits 36. The plurality of common power terminals 42 include a first common power terminal 42A and a second common power terminal 42B. The first common power terminal 42A is electrically connected to the first processing circuit 36A. The second common power terminal 42B is electrically connected to the second processing circuit 36B.

The first common power terminal 42A and the first individual power terminal 40A are electrically connected to each other via a conductive wire 44a. The conductive wire 44a and the first processing circuit 36A are electrically connected to each other via a conductive wire 44b. Further, the second common power terminal 42B and the second individual power terminal 40B are electrically connected to each other via a conductive wire 44c. The conductive wire 44c and the second processing circuit 36B are electrically connected to each other via a conductive wire 44d.

FIG. 4 is a view showing a state in which the conductive member 32 is attached to the signal processing module 30 of FIG. 3.

The conductive member 32 is attachable to and detachable from the electronic device 10. The conductive member 32 has electrical conductivity. The conductive member 32 is in contact with the first common power terminal 42A and the second common power terminal 42B. As a result, the first common power terminal 42A and the second common power terminal 42B are electrically connected to each other.

The conductive member 32 is exposed to outside on the left side of the electronic device 10. Accordingly, the conductive member 32 can be electrically connected to the other unit 100 (100L) installed on the left side of the electronic device 10. The conductive member 32 is also exposed to outside on the right side of the electronic device 10. Accordingly, the conductive member 32 can be electrically connected to the other unit 100 (100R) installed on the right side of the electronic device 10. The conductive member 32 is substantially symmetrically exposed to outside on the left side of the electronic device 10 and the right side of the electronic device 10. However, the conductive member 32 may be asymmetrically exposed to outside on the left side of the electronic device 10 and the right side of the electronic device 10.

The dashed arrows in FIG. 4 simply illustrate the flow of electric power supply. As indicated by the dashed arrows, when the other unit 100L and the conductive member 32 are electrically connected to each other, power can be supplied from the other unit 100L to the first processing circuit 36A and the second processing circuit 36B. The conductive member 32 is also electrically connected to the other unit 100R. Therefore, power can be supplied also to the other unit 100R (the processing circuit of the other unit 100R) from the other unit 100L via the conductive member 32. Alternatively, power may be supplied to the first processing circuit 36A, the second processing circuit 36B, and the other unit 100L (the processing circuit of the other unit 100L) from the other unit 100R via the conductive member 32.

Alternatively, power may be supplied from the electronic device 10 to the other unit 100L and the other unit 100R. That is, the plurality of individual power terminals 40, the other unit 100L, and the other unit 100R are electrically connected via the conductive member 32. One of the plurality of individual power terminals 40 is connected to a power supply via the power connector 24. Thus, power can be supplied from the power supply to the other unit 100L and the other unit 100R via the electronic device 10.

The conductive member 32 may be removed from the electronic device 10. In this case, the first individual power terminal 40A is connected to a power supply. The first individual power terminal 40A is connected to the power supply through its own power connector 24. Thus, the power supply connected to the first individual power terminal 40A can supply electric power to the first processing circuit 36A. In addition, the second individual power terminal 40B may be connected to another power supply through its own power connector 24. Thus, the power supply connected to the second individual power terminal 40B can supply electric power to the second processing circuit 36B.

According to the present embodiment, the operator can easily change the number of processing circuits connected to one power supply. The operator can supply power from one power supply to a plurality of electronic devices 10 by attaching the conductive member 32 to the electronic device 10. This is preferable for the operator in that the number of required power supplies can be reduced. It is also preferable for the operator in that wiring of the power supply is simplified. On the other hand, the operator may remove the conductive member 32. This allows the operator to separate the plurality of processing circuits 36 into a plurality of groups. The plurality of processing circuits 36 receive power supply from different power supplies, for each group. Accordingly, for example, even when an abnormality occurs in one power supply, the processing circuits 36 of the groups corresponding to the power supplies other than the abnormal power supply can continue the operation. That is, the availability of the communication system 12 is secured.

Modifications

Hereinafter, some specific examples of the exemplary modifications according to the embodiment will be described. However, components already described in the embodiment are denoted by the same reference numerals as in the embodiment. In addition, differences from the embodiment will be mainly described below, and redundant description will be omitted as much as possible.

Modification 1

Figure 5:
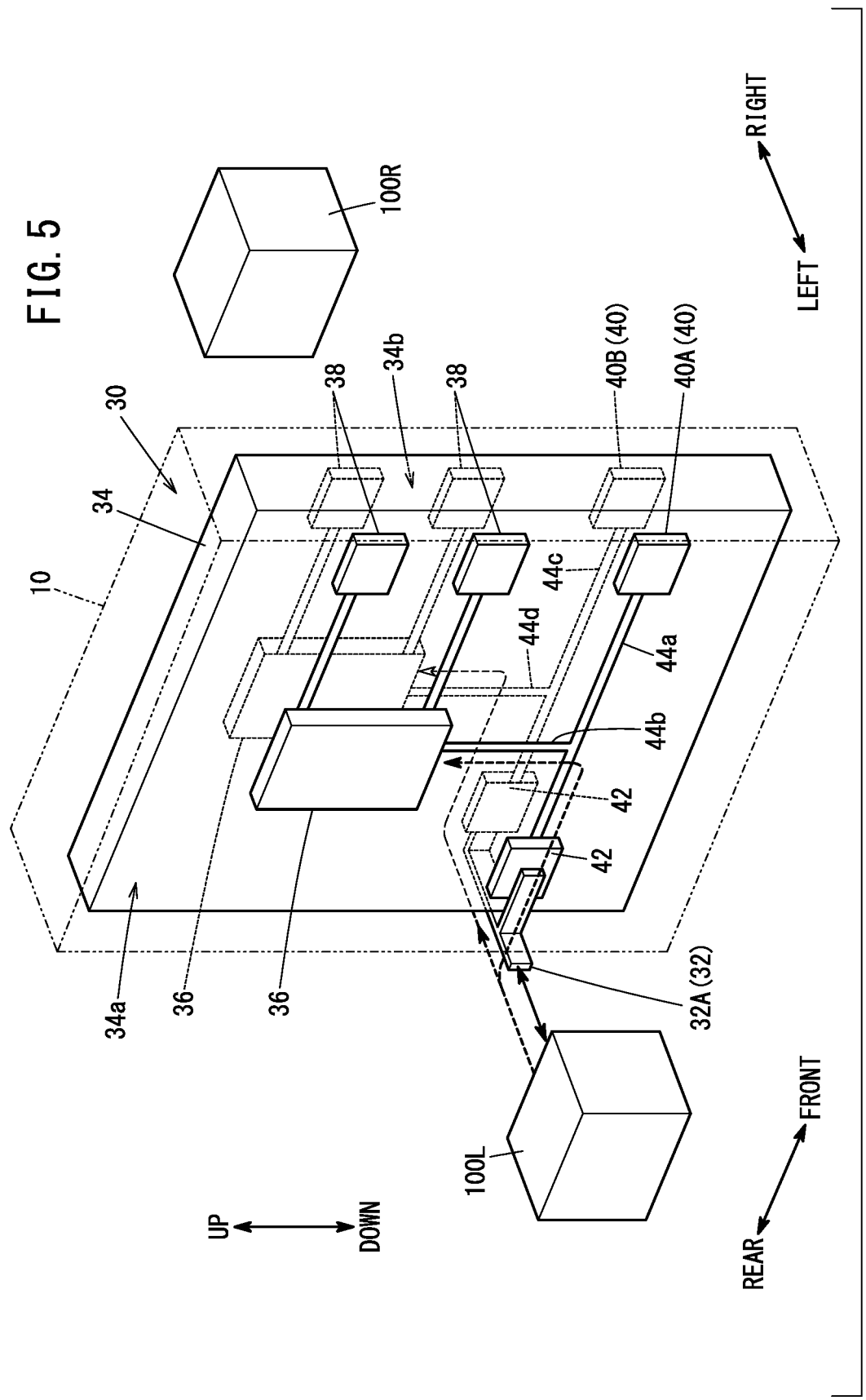
FIG. 5 is a diagram illustrating an electronic device provided with a conductive member according to a first modification.

FIG. 5 is a diagram illustrating the electronic device 10 provided with the conductive member 32A (32) according to a first modification.

The conductive member 32A is a member that is electrically connected to one of the other unit 100L and the other unit 100R and to the plurality of processing circuits 36 of the electronic device 10. In the example of FIG. 5, the conductive member 32A is electrically connected to the other unit 100L and the plurality of processing circuits 36 of the electronic device 10. In this case, the electronic device 10 including the conductive member 32A can receive power supply from the other unit 100L. However, power may be supplied from the electronic device 10 to the other unit 100L. The other unit 100R is connected to a power supply different from the power supply that supplies power to the electronic device 10 and the other unit 100L.

Figure 6:
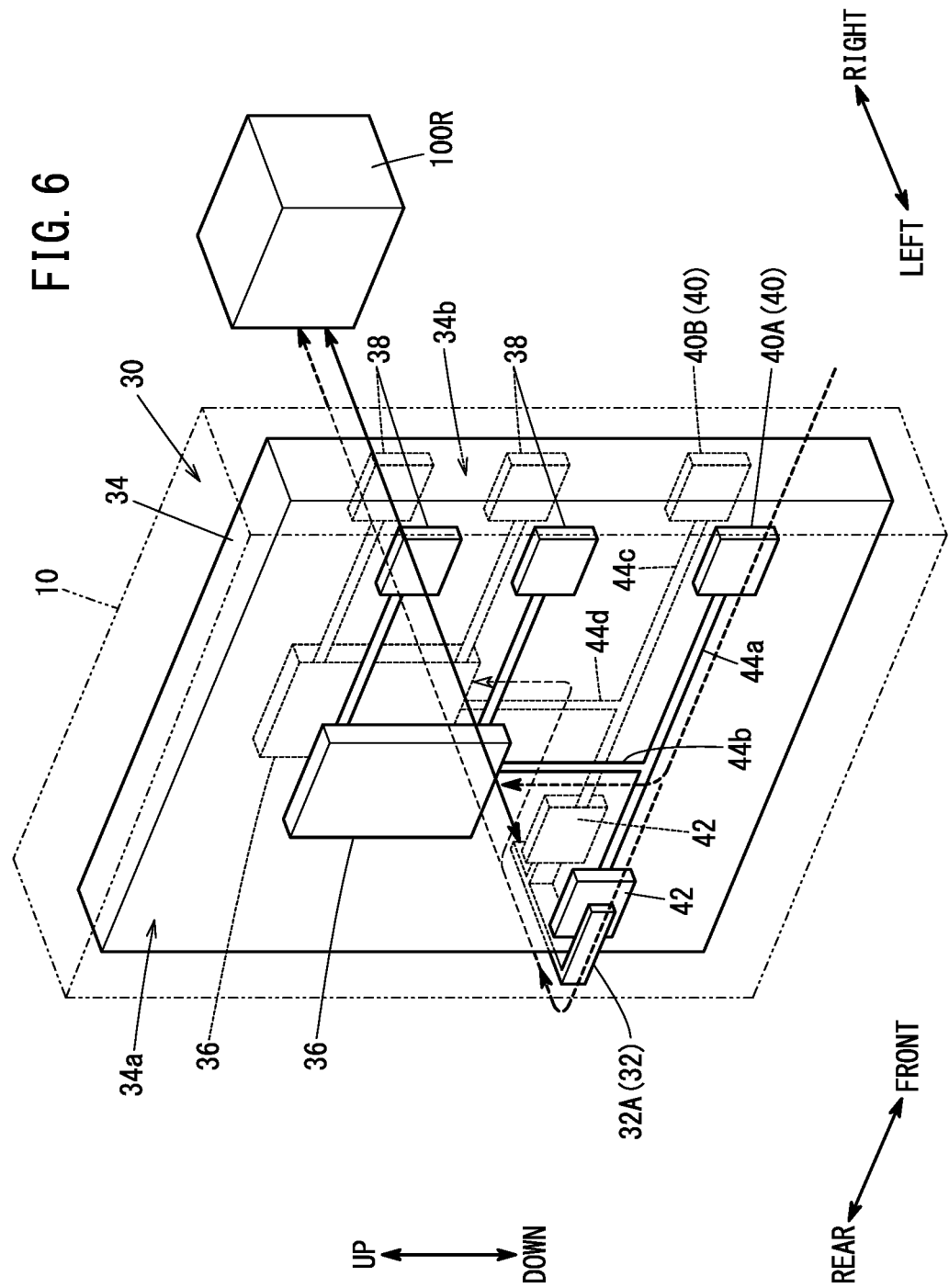
FIG. 6 is a diagram illustrating an electronic device provided with a conductive member according to a first modification, which is an example different from FIG. 5.

FIG. 6 is a diagram showing an electronic device 10 provided with a conductive member 32A according to a first modification, which is an example different from FIG. 5.

When the other unit 100R and the plurality of processing circuits 36 of the electronic device 10 are electrically connected to each other via the conductive member 32A, the electronic device 10 including the conductive member 32A can receive power supply from the other unit 100R. Power may be supplied from the electronic device 10 to the other unit 100R.

Modification 2

Figure 7:
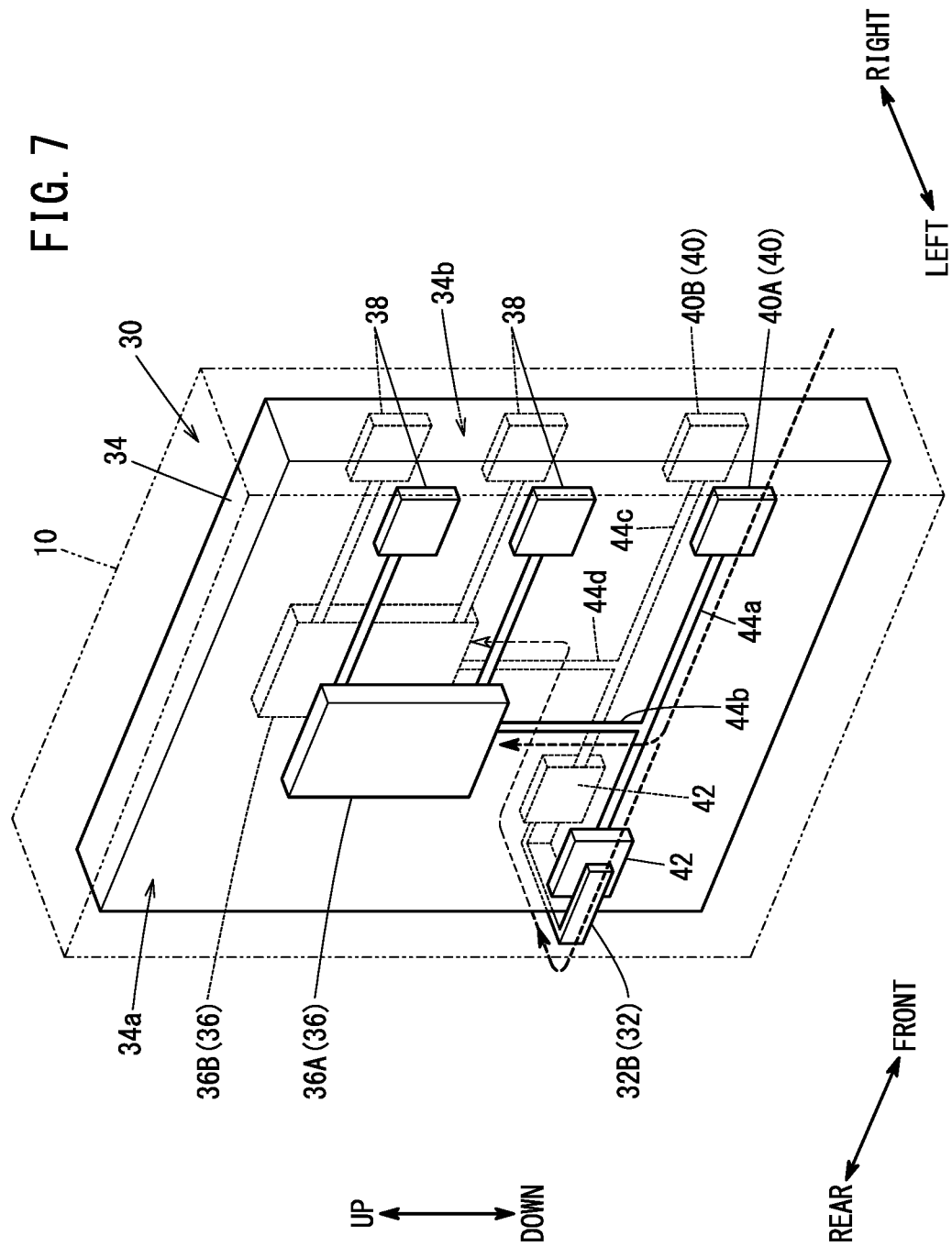
FIG. 7 is a diagram illustrating a state in which a power supply is connected to an individual power terminal of an electronic device provided with a conductive member according to a second modification.

FIG. 7 is a diagram illustrating a state in which a power supply is connected to the individual power terminals 40 of the electronic device 10 provided with the conductive member 32B (32) according to a second modification.

The conductive member 32B is a member that is electrically connected to the plurality of processing circuits 36 (36A and 36B) of the electronic device 10 but is not electrically connected to the other units 100. In this case, one of the first individual power terminal 40A and the second individual power terminal 40B is connected to the power supply. Thus, power is supplied from the power supply to both the first individual power terminal 40A and the second individual power terminal 40B.

Note that each of the conductive member 32 of the embodiment, the conductive member 32A of the first modification, and the conductive member 32B of the present modification may be provided to the operator.

Modification 3

Figure 8A:
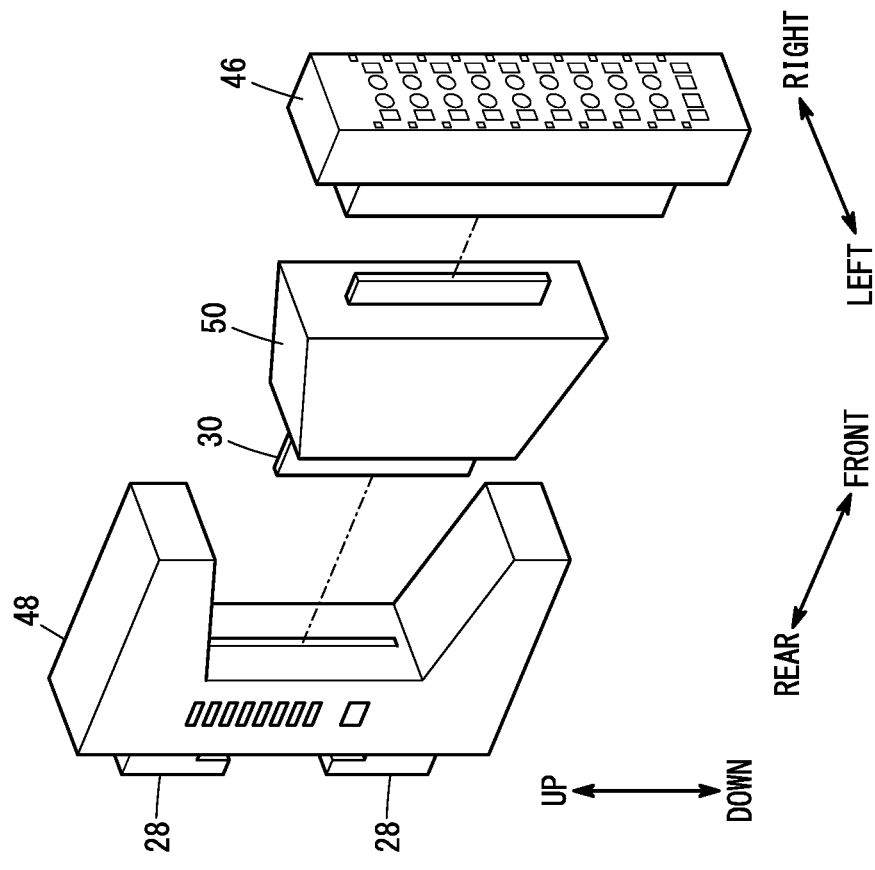
FIG. 8A is a diagram illustrating an electronic device according to a third modification.
Figure 8B:
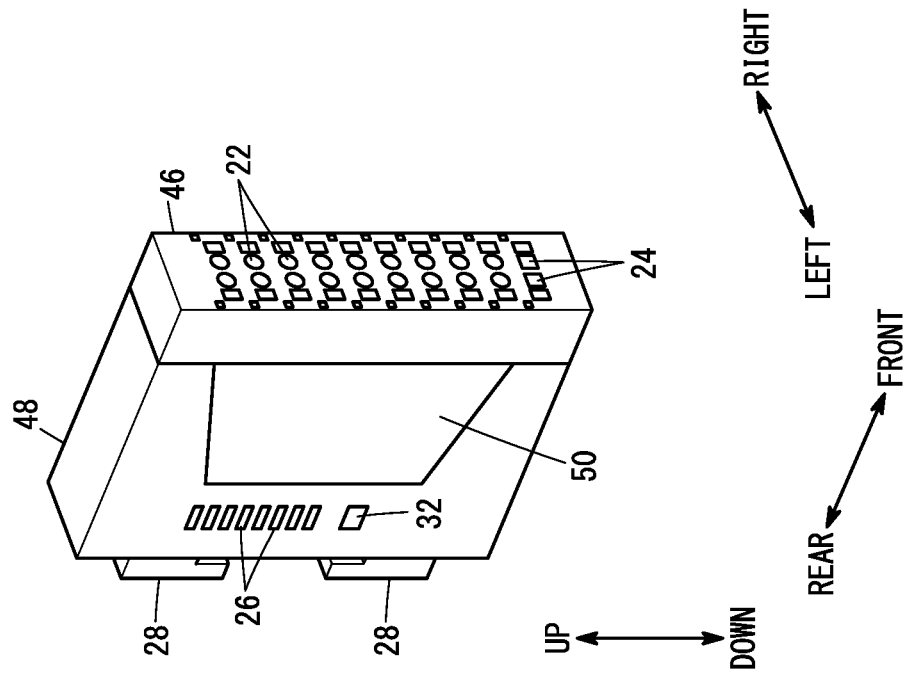
FIG. 8B is an exploded view of the electronic device of FIG. 8A.

FIG. 8A is a diagram illustrating an electronic device 10A (10) according to a third modification. FIG. 8B is an exploded view of the electronic device 10A of FIG. 8A.

The electronic device 10A may be separable into a plurality of units. The electronic device 10A of the present modification can be separated into a connector unit (terminal block) 46, a base unit 48, and a signal processing unit 50. The connector unit 46, the signal processing unit 50, and the base unit 48 are arranged in this order in the rearward direction (FIG. 8B).

The connector unit 46 is a unit including the plurality of inserted portions 22 and the plurality of power connectors 24. The base unit 48 is a unit including the plurality of contactors 26 and the end engagement portions 28. The conductive member 32 is detachably installed on the base unit 48. The signal processing unit 50 is a unit including the signal processing module 30. By dividing the electronic device 10 into the plurality of units, maintenance work of the electronic device 10 can be easily performed.

The base unit 48 provided with the conductive member 32 and the base unit 48 not provided with the conductive member 32 may be separately provided to the operator. In addition, a base unit 48 which the conductive member 32 is attachable to and detachable from may be provided to the operator. Particularly in the former case, the operator can easily change the connection mode to the power supply simply by changing the base unit 48.

Modification 4

The division of the electronic device 10 is not limited to the illustration in FIG. 8A. For example, the base unit 48 and the signal processing unit 50 may be integrally formed. Further, the signal processing unit 50 and the connector unit 46 may be integrally provided.

Inventions that can be Obtained from the Embodiment

The inventions that can be grasped from the above-described embodiment and the modifications thereof will be described below.

The electronic device (10) that performs input and output of a signal, includes: the plurality of processing circuits (36) configured to perform input and output of the signal; the plurality of common power terminals (42) connected respectively to the different processing circuits to supply electric power to each of the plurality of processing circuits; the plurality of individual power terminals (40) connected respectively to the different processing circuits to supply electric power to each of the plurality of processing circuits; and the conductive member (32) attachably and detachably provided and configured to electrically connect the plurality of common power terminals to each other.

With this configuration, the electronic device in which the connection mode to the power supply can be easily changed is provided.

Each of the plurality of individual power terminals may be a terminal configured to connect a power supply and each of the processing circuits in order to supply electric power to each of the processing circuits. Thus, power can be supplied to the plurality of processing circuits by connecting a power supply to the plurality of individual power terminals.

The conductive member may be electrically connected to a first other electronic device (100L, 100R) adjacent to the electronic device in a first direction and may supply electric power supplied from the first other electronic device, to the plurality of processing circuits. With this configuration, power can be supplied from the first other electronic device to the plurality of processing circuits.

The conductive member may be electrically connected to the second other electronic device (100R, 100L) adjacent to the electronic device in a second direction opposite to the first direction and may supply the electric power to the second other electronic device. Accordingly, by supplying power to the electronic device, electric power can be supplied to the processing circuit of the second other electronic device.

The conductive member may supply electric power supplied from at least one of the plurality of individual power terminals, to the plurality of processing circuits. Thus, the number of necessary power supplies can be reduced.

The conductive member may be electrically connected to another electronic device (100R, 100L) adjacent to the electronic device in a predetermined installation direction and may supply the electric power to the other electronic device. Thus, by supplying electric power to the electronic device, electric power can be supplied to the processing circuit of the other electronic device.

The electronic device may further include the circuit board (34) including the first surface (34*a*) and the second surface (34*b*) and provided with the plurality of processing circuits, wherein the plurality of common power terminals may include at least one first common power terminal provided on the first surface and at least one second common power terminal provided on the second surface.

The electronic device may be divided into: the signal processing unit (50) including the plurality of processing circuits, the plurality of common power terminals, and the plurality of individual power terminals; and the base unit (48) that is attachable to and detachable from the signal processing unit and that is configured to detachably support the conductive member. This facilitates maintenance work of the electronic device.

The electronic device may further include the terminal block (46) configured to be connected to the device (16) serving as an input/output target of the signal, wherein the terminal block may be provided with connectors (24) configured to connect the plurality of individual power terminals to the plurality of power supplies.

The electronic device may be an I/O unit.

The invention claimed is:

1. An electronic device that performs input and output of a signal, comprising:
   a plurality of processing circuits configured to perform input and output of the signal;
   a plurality of common power terminals connected respectively to the different processing circuits to supply electric power to each of the plurality of processing circuits;
   a plurality of individual power terminals provided separately from the plurality of common power terminals and connected respectively to the different processing circuits to supply electric power to each of the plurality of processing circuits; and
   a conductive member attachably and detachably provided and configured to electrically connect the plurality of common power terminals to each other,
   wherein the plurality of individual power terminals are electrically connected to each other via the conductive member and the plurality of common power terminals are electrically connected to each other by the conductive member.

2. The electronic device according to claim 1, wherein each of the plurality of individual power terminals is a terminal configured to connect a power supply and each of the processing circuits in order to supply electric power to the processing circuits individually.

3. The electronic device according to claim 1, wherein the conductive member is electrically connected to a first other electronic device that is adjacent to the electronic device in a first direction and supplies electric power supplied from the first other electronic device, to the plurality of processing circuits.

4. The electronic device according to claim 3, wherein the conductive member is electrically connected to a second other electronic device that is adjacent to the electronic device in a second direction opposite to the first direction and supplies the electric power to the second other electronic device.

5. The electronic device according to claim 1, wherein the conductive member supplies electric power supplied from at least one of the plurality of individual power terminals, to the plurality of processing circuits.

6. The electronic device according to claim 5, wherein the conductive member is electrically connected to another electronic device that is adjacent to the electronic device in a predetermined installation direction and supplies the electric power to the other electronic device.

7. The electronic device according to claim 1, further comprising a circuit board including a first surface and a second surface, and provided with the plurality of processing circuits,
   wherein the plurality of common power terminals comprise at least one first common power terminal provided on the first surface and at least one second common power terminal provided on the second surface.

8. The electronic device according to claim 1, wherein the electronic device is divided into:
   a signal processing unit including the plurality of processing circuits, the plurality of common power terminals, and the plurality of individual power terminals; and
   a base unit that is attachable to and detachable from the signal processing unit and that is configured to attachably and detachably support the conductive member.

9. The electronic device according to claim 1, further comprising a terminal block configured to be connected to a device serving as an input/output target of the signal,
   wherein the terminal block is provided with connectors configured to connect the plurality of individual power terminals to a plurality of power supplies.

10. The electronic device according to claim 1, wherein the electronic device is an I/O unit.

* * * * *